United States Patent [19]

Crooks et al.

[11] Patent Number: 4,746,863
[45] Date of Patent: May 24, 1988

[54] CONTIGUOUS SLICES IN MULTI-SLICE MRI

[75] Inventors: Lawrence E. Crooks, Richmond; David A. Feinberg, Berkeley; John C. Hoenninger, III, Oakland, all of Calif.

[73] Assignee: The Regents of the University of California, Berkeley, Calif.

[21] Appl. No.: 795,914

[22] Filed: Nov. 7, 1985

[51] Int. Cl.$^4$ ............................................. G01R 33/20
[52] U.S. Cl. ....................................... 324/304; 324/314
[58] Field of Search ................................. 324/309, 314

[56] References Cited

U.S. PATENT DOCUMENTS

| | | | |
|---|---|---|---|
| 4,297,637 | 10/1981 | Crooks et al. | 324/309 |
| 4,318,043 | 3/1982 | Crooks et al. | 324/309 |
| 4,443,760 | 4/1984 | Edelstein et al. | 324/309 |
| 4,458,203 | 7/1984 | Young | 324/309 |
| 4,471,305 | 9/1984 | Crooks et al. | 324/309 |
| 4,516,582 | 5/1985 | Redington | 324/309 X |
| 4,549,140 | 10/1985 | MacFall | 324/309 |
| 4,599,565 | 7/1986 | Hoenninger, III et al. | 324/309 |
| 4,642,567 | 2/1987 | Kaplan | 324/309 |
| 4,665,367 | 5/1987 | Kramer et al. | 324/309 |

OTHER PUBLICATIONS

Feinberg et al., "Pulsatile Blood Velocity in Human Articles Displayed by Magnetic Resonance Imaging", Radiology, 153:177–180, 1984.

Kumer, Welti, Earnst, J. Mag. Res. 18, 69–83, 1975, "NMR Fourier Zaugnatosrophy".

Crooks et al., "Thin Section Definition in Magnetic Resonance Imaging: Technical Concepts and their Implementation" Radiology 154:463–467, 1985.

"Selective Pulses in NMR Imaging: a Reply to Criticism" by P. Mansfield et al., J. Mag. Res. 33, 261–274 (1979).

"The Solution of the Bloch Equations in the Presence of a Varying $B_1$ Field—an Approach to Selective Pulse Analysis" by D. I. Hoult, J. Mag. Res. 35, 69–86 (1979).

"Variations in Slice Shape and Absorbtion as Artifacts in the Determination of Tissue Parameters in NMR Imaging" by I. R. Young et al., Mag. Res. Med. 2, 355–389 (1985).

"Selective Irradiation Line Scan Techniques for NMR Imaging" by Lawrence E. Crooks, IEEE Trans. N. Sci., NS-27, No. 3, 1239–1244 (Uun. 1980).

Primary Examiner—Tom Noland
Attorney, Agent, or Firm—Larry S. Nixon

[57] ABSTRACT

In a multi-slice magnetic resonance imaging system which employs a train of plural RF NMR nutation pulses, the frequency spectrum and/or magnetic gradient employed for succesive pulses is controlled so as to effect more nearly equal full-width-half-magnitude (FWHM) or other spatial dimensions of actual nuclei nutation variation versus distance curves for all of the slice selective nutation pulses. The result is a reduction of any "gap" of non-imaged volume disposed between the succession of selected MRI slice volumes.

28 Claims, 7 Drawing Sheets

$$f_o = \gamma H_o$$

WHERE $f_o$ = LARMOR RESONANT FREQUENCY (Hz)

$H_o$ = INTENSITY OF MAGNETIC FIELD (GAUSS)

$\gamma$ = MAGNETOGYRIC RATIO (a constant for a given atom in given environment.)

$Z_o$ = LOCATION OF SELECTED PLANE IF SINGLE NMR EXCITATION RF FREQUENCY $f_o$ IS USED $S_o$ = "PLANAR" VOLUME ACTUALLY SELECTED BY NMR EXCITATION PULSES SHAPED AS SINC IN TIME DOMAIN TO PRODUCE "SQUARE" EDGE FREQUENCY SPECTRUM $\Delta f_o$ IN FREQUENCY DOMAIN.

F I G. 6
CONTIGUOUS SLICE NMI $\Delta f_{90} = 2 \text{ KHz}$
$G_{z90} = 0.5 \text{ GAUSS/cm} \simeq 2.13 \text{ KHz/cm FOR Hz}$
$S_1 \text{ SLICE WIDTH}_{90} = 2.13/2 = 1.06 \text{ cm}$
$\Delta f_{180} = 2 \text{ KHz}$
$G_{z180} = .4 \text{ GAUSS/cm} \simeq 1.70 \text{ KHz/cm FOR Hz}$
$S_1 \text{ SLICE WIDTH}_{180} = (1.70/2)0.8 = 1.06 \text{ cm}$ $fc_{0_{90}} = fc_{0_{180}}$ IS THE CENTER LARMOR FREQUENCY WHEN NO GRADIENTS ARE PRESENT.

FOR $S_1$, $fc_{1_{90}} = fc_{0_{90}} + f_{inc_{90}}$   $fc_{1_{180}} = fc_{0_{180}} + f_{inc_{180}}$
FOR $S_2$, $fc_{2_{90}} = fc_{1_{90}} + f_{inc_{90}}$   $fc_{2_{180}} = fc_{1_{180}} + f_{inc_{180}}$
FOR $S_3$, $fc_{3_{90}} = fc_{2_{90}} + f_{inc_{90}}$   $fc_{3_{180}} = fc_{2_{180}} + f_{inc_{180}}$ $G_{z180} = .8 \, G_{z90}$
$f_{inc_{90}} = \Delta f_{90}$
$f_{inc_{180}} = 0.8 \, \Delta f_{180}$

CONTIGUOUS SLICES IN MULTI-SLICE MRI

BACKGROUND OF THE INVENTION

This invention relates to the field of magnetic resonance imaging (MRI) utilizing nuclear magnetic resonance (NMR) phenomena. It is particularly related to novel apparatus and method for acquiring NMR images from adjacent planar volumes or slices of a three-dimensional subject while reducing non-imaged "gaps" between such adjacent slices—while yet permitting the necessary NMR image data to be obtained in a single complete measurement sequence. This advantageous result simultaneously permits some relaxation in the gradient coil driving requirements as well.

This application is related to earlier-filed, commonly assigned, patents and applications of Crooks et al including U.S. Pat. Nos. 4,297,637; 4,318,043; 4,471,305; and pending (now allowed) application Ser. No. 515,177 and now U.S. Pat. No. 4,599,565. The contents of these teferenced related patents and/or patent applications is hereby incorporated by reference.

Magnetic resonance imaging (MRI) is now coming into widespread commercial usage. Nevertheless, there are still many possible areas for improvement. One such area for potential improvement relates to more efficient data acquisition techniques. Another area for potential improvement relates to improvements in the quality of the resulting images.

Multiple section imaging as performed by Crooks et al (see the above-referenced related U.S. patents and patent applications and see also Kumar, Welti, Earnst at J. Mag. Res. 18, 69–83, 1975) utilizes slice selective magnetic gradient pulses which are "on" during each radio frequency pulse (e.g. 90° nutation pulses and 180° nutation pulses) so as to achieve NMR at the Larmor frequency within a selected planar volume without substantially disturbing the spin lattice of adjacent planar volumes. (Each incident radio frequency pulse is typically amplitude modulated by a sinc(t) function so as to select a substantially square edged volume in the spatial domain.)

Slice or other partially selective NMR, in general, has been extensively studied and reported in the literature. See, for example:

"Selective Pulses in NMR Imaging: A Reply To Criticism" by P. Mansfield et al, J. Mag. Res. 33, 261–274 (1979)

"The Solution of The Block Equations in the Presence of a Varying $B_1$ Field—An Approach to Selective Pulse Analysis" by D. I. Hoult, J. Mag. Res. 35, 69–86 (1979)

"Variations in Slice Shape and Absorption as Artifacts in the Determination of Tissue Parameters in NMR Imaging" by I. R. Young et al, Mag. Res. Med. 2, 355–389 (1985)

"Selective Irradiation Line Scan Techniques for NMR Imaging" by Lawrence E. Crooks, IEEE Trans. N. Sci., NS-27, No. 3, 1239–1244 (June 1980).

After extracting the useful spin echo NMR RF response from a given planar volume, it is allowed to relax to its quiescent alignment with a static z-axis magnetic field while, in the meantime, other planar volumes are similarly selectively defined by suitable magnetic gradient pulses and sinc-modulated RF NMR pulses (with offset frequency spectra) so as to produce the desired NMR spin echo responses from a succession of other planar volumes.

After a sequence of planar volumes have thus been irradiated and their respective NMR responses captured for subsequent analysis, the entire cycle is repeated many times with incrementally increased magnetic gradient pulses along an orthogonal y-axis so as to encode spatial information. Spatial information for the second x-axis dimension is typically encoded by imposing a constant magnetic gradient pulse along the x-axis during each spin echo NMR signal readout. The y-axis phase encoding is changed for each of M NMR cycles so as to provide a linearly increasing progression of y-axis phase encodings (the number of resulting image lines along the y-axis will be equal to the number M of phase encoding cycles of the sequence). A two-dimensional Fourier transformation process is then utilized to obtain the final NMR image (see above referenced U.S. patent application No. 515,117).

Figure 2:
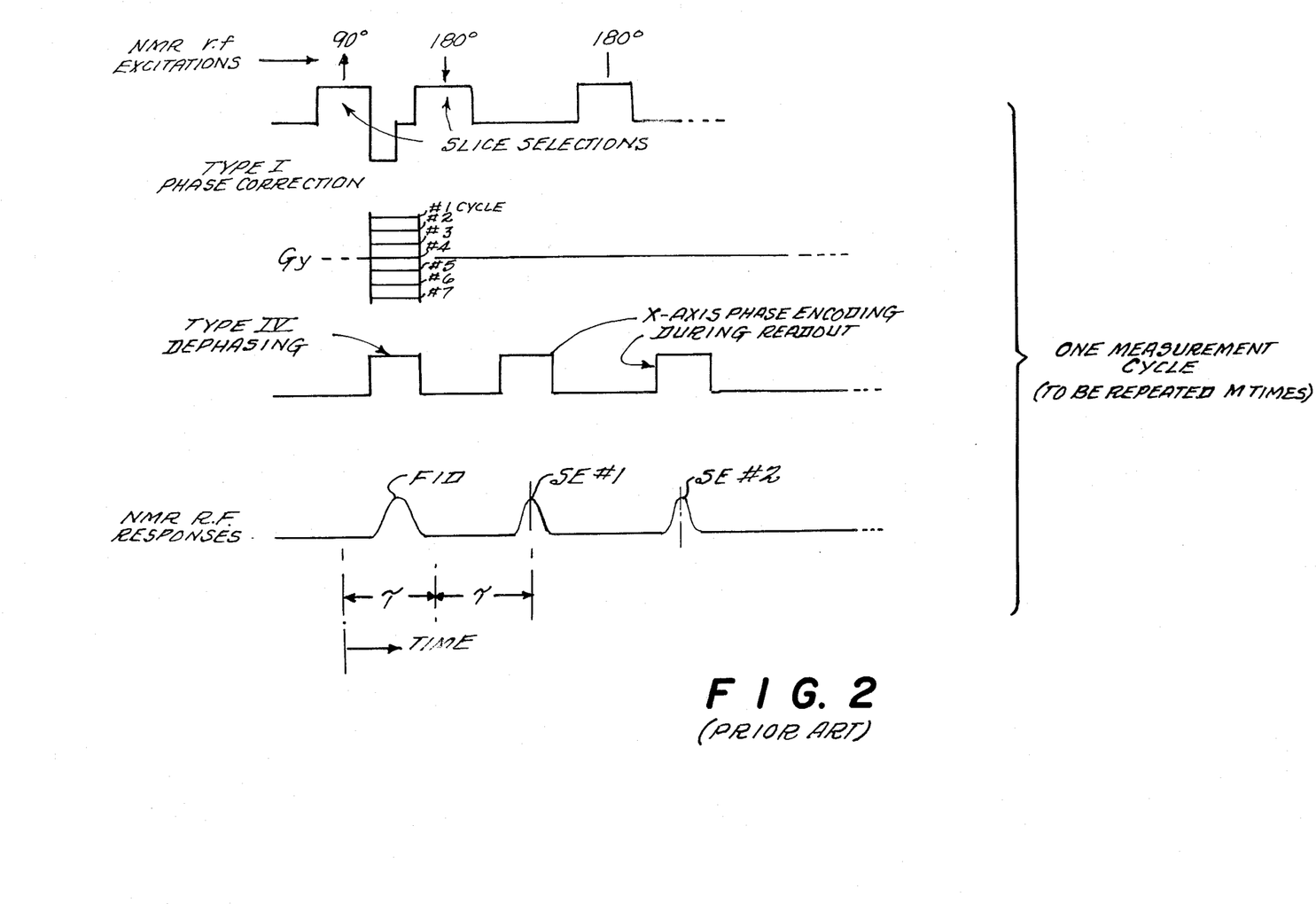
FIG. 2 is a schematic waveform diagram depicting a typical prior art Crooks et al data acquisition procedure.

This prior Crooks et al technique is depicted at FIG. 2 of the present application. As will be appreciated, for a given y-axis resolution of M lines per image, one must repeat the measurement cycle M times. A given measurement cycle can only be repeated after at least about one T1 interval (often on the order of one second or more).

The TE time interval between the successive spin echoes in a given measurement cycle permits the T2 NMR time constant to be calculated while the TR time interval between repetitions of the measurement cycle within a given complete measurement sequence permits the T1 time constant to be calculated. In this way, one may calculate and display NMR images of the T1 and/or T2 time constants for each elemental voxel of nuclei. Typically, the easiest NMR image to obtain simply displays the measured NMR response signal intensity for each elemental voxel within the image field thus avoiding the extra time and complexity required to calculate T1 and/or T2 NMR time constants.

Although a sinc shaped envelope is used in the time domain for the RF nutation pulses in an attempt to achieve a "square" shaped frequency spectrum, such perfection is not absolutely achievable in practice. For example, a practical system cannot utilize RF nutation pulses with a true complete sinc shaped envelope since that would imply an infinitely long time duration for the RF nutation pulse. Accordingly, a somewhat truncated version of the sinc function is actually utilized and this itself will give rise to some slope at the edges of the frequency spectrum envelope which results (as will be apparent to those in the art from a consideration of the Fourier transform relationships between the time domain and frequency domain). The actual region in which magnetization is nutated depends only to first order on the frequency content of the RF pulse. The actual distribution of magnetization depends on non-linear interaction of spin magnetization with the time varying (modulated) RF magnetic field. Detailed techniques for analyzing this interaction are given in the references by Mansfield and Hoult. Furthermore, where a succession of slice selective RF nutation pulses are utilized in each measurement cycle (as shown in FIG. 2), the net resulting useful signal actually depends upon accurate spatial conjunction of each of the individual slice selection processes associated with each of the RF nutation pulses.

For these and perhaps various other reasons, it has heretofore been necessary to assume certain minimum sized "gaps" between the selected slices for which NMR image data is collected within a given single data acquisition sequence (e.g. M repetitions of the FIG. 2 basic measurement cycle). In effect, this gap has resulted because of an inability to achieve accurate NMR nutation effects out to the extreme edges of a desired planar volume or slice through the object under test. Rather, at the outer edges of any such attempted slice selection geometry, one does not truly achieve either 90° or 180° nutation but, rather, something much less. It is only in the central portion of the selected slice volume that one actually obtains the desired 90° and 180° nuclei nutation. Accordingly, either (a) the nuclei towards the edges of the selected slices do not contribute at all to the measured NMR responses (in which case they truly represent a non-imaged "gap") or, (b) to the extent they may produce some measurable NMR responses, those responses are not the actually desired response and hence tend to contaminate and degrade the desired NMR imaging process.

SUMMARY OF THE INVENTION

Now, however, we have discovered method and apparatus for achieving a desired degree of nutation in a succession of slice selective RF nutation pulses extending more uniformly throughout a larger central area of the selected slice or planar volume. The result is greatly reduced "gaps" between such selected slices. In particular, it has been discovered that if one uses conventional slice selection parameters for the 90° and 180° nutation pulses (i.e. equal strength $G_z$ gradient pulses and equal frequency spectra) the effectively selected slice width for the 180° nutation pulse (when used to produce spin echoes) is only about 80% of the effectively selected slice width for the 90° nutation pulse.

Accordingly, this invention provides apparatus/method for achieving more closely matched selected slice widths for the 90° and 180° nutation pulses. As a result, it is possible to substantially minimize any non-imaged gap between successive selected slices within a single complete data acquisition sequence (e.g. M repetitions of a measurement cycle such as that shown in FIG. 2).

The matching of nutation versus displacement curves for the 90° and 180° nutation pulses can be obtained in a variety of ways. For example, the effective selected slice width for the 90° pulse could be reduced (e.g. to 80% of its usual value) or the effective slice width selected by the 180° pulse might be increased (e.g. by 125%) so as to achieve substantially equal selected slice widths for all of the sequence of RF nutation pulses used in a given individual measurement cycle.

Such adjustments to the selected slice width can be achieved by changing the slice selective magnetic gradient pulse utilized during each applied RF nutation pulse and/or by altering the shape/duration of the RF nutation pulse envelope itself. In the preferred exemplary embodiment, the selected slice width for the 180° nutation pulse is increased, at least in part, by reducing the strength of the magnetic gradient pulse and thus achieving an additional simultaneous advantage in relaxing the power dissipation, etc. requirements for the magnetic gradient driving amplifiers and the like.

BRIEF DESCRIPTION OF THE DRAWINGS

These as well as other objects and advantages of this invention will be more completely understood and appreciated by careful study of the following detailed description of the presently preferred exemplary embodiment of this invention, in conjunction with the accompanying drawings of which.

DESCRIPTION OF THE PREFERRED EMBODIMENTS

Figure 1:
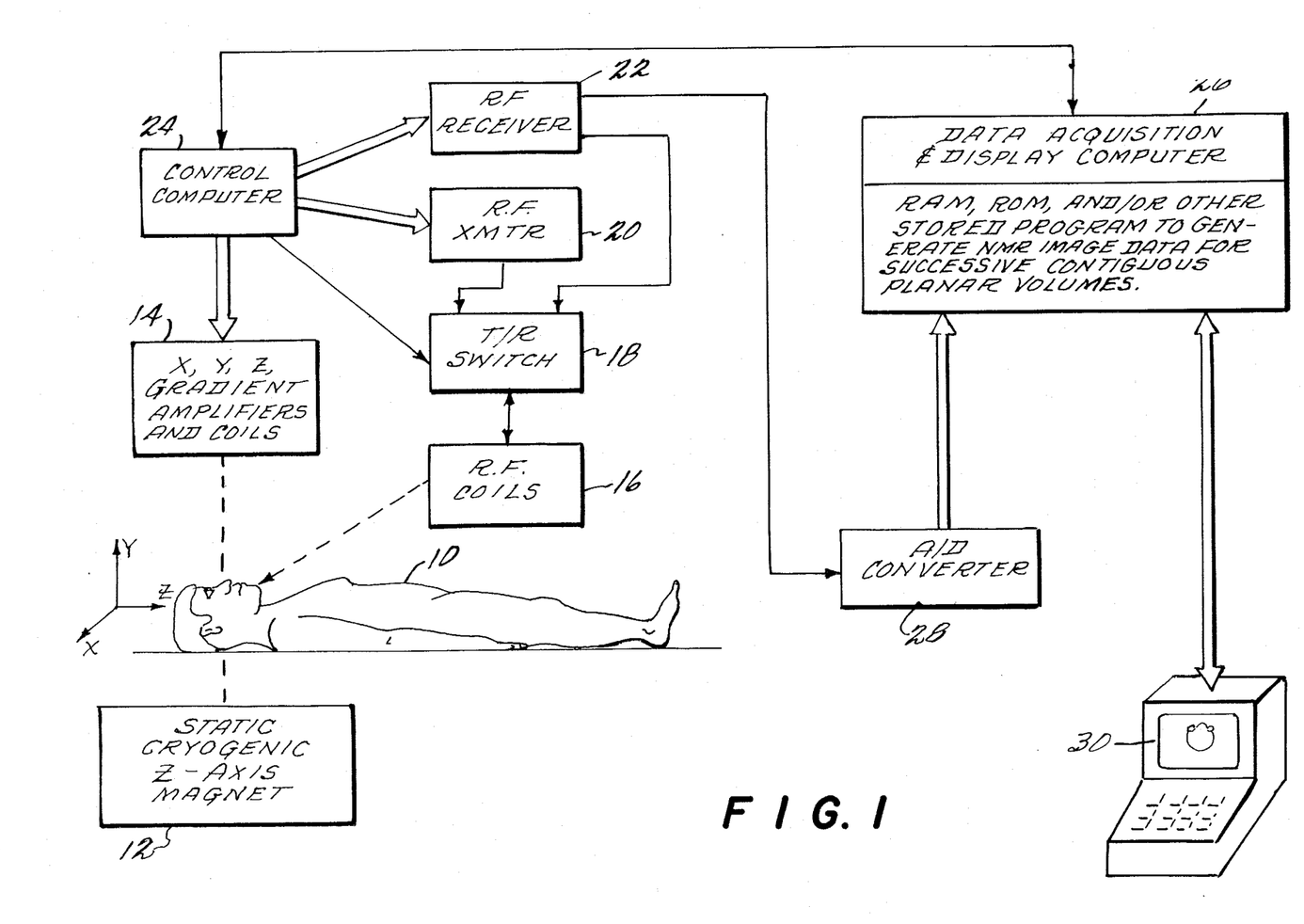
FIG. 1 is a block diagram of a typical MRI scanner system programmed so as to practice the novel data acquisition and processing procedure of this invention.

The novel data acquisition/processing procedure utilized by this invention can typically be achieved by suitable alteration of stored controlling computer programs in existing MRI apparatus. As an example of such typical apparatus, the block diagram of FIG. 1 depicts the general architecture of the Crooks et al system described in more detail in the above-referenced related patents and/or patent applications of Crooks et al.

Typically, a human or animal subject (or other object) 10 is inserted along the z-axis of a static cryogenic magnet 12 which establishes a substantially uniform magnetic field directed along the z-axis within the portion of the object of interest. Gradients may be imposed within this z-axis directed magnetic field along the x, y or z axes by a set of x, y, z gradient amplifiers and coils 14. NMR RF signals are transmitted into the body 10 and NMR RF responses are received from the body 10 via RF coils 16 connected by a conventional transmit/receive switch 18 to an RF transmitter 20 and RF receiver 22.

All of the prior mentioned elements may be controlled, for example, by a control computer 24 which communicates with a data acquisition and display computer 26. The latter computer 26 may also receive NMR RF responses via an analog to digital converter 28. One or more CRT display and keyboard units 30 are typically also associated with the data acquisition and display computer 26.

As will be apparent to those in the art, such an arrangement may be utilized so as to generate desired sequences of magnetic gradient pulses and NMR RF pulses and to measure desired NMR RF responses in accordance with stored computer programs. As depicted in FIG. 1, the MRI system of this invention will typically include RAM, ROM and/or other stored program media adapted (in accordance with the following descriptions) so as to generate MRI data for substantially contiguous slice volumes and to process same into corresponding visual display images.

FIG. 2 depicts a typical prior art Crooks et al data acquisition sequence. For example, each measurement cycle may be initiated by a 90° NMR RF excitation followed by a 180° NMR RF nutation pulse located $\tau$ later in time and, if desired for signal averaging or T2 calculation purposes, followed by subsequent 180° RF nutation pulses (typically distributed at $2\tau$ time intervals). It will be noted that during each RF excitation pulse there is a slice selection $G_z$ magnetic gradient pulse switched "on" so as to selectively excite only the desired "slice" or "planar volume" (e.g. a slice of given relatively small thickness through the object being imaged). During each resulting spin echo NMR RF response, x-axis phase encoding is achieved by applying an x-axis magnetic gradient during the readout procedure (typically each spin echo pulse is sampled every 30 microseconds or so with a digitized value being stored for later processing).

In addition, a cycle-dependent y-axis phase encoding pulse is employed typically having a different magnitude on each measurement cycle. Although only seven measurement cycles are explicitly depicted in FIG. 2, it will be understood that in practice the number of measurement cycles must be equal to the number of desired lines of resolution along the y-axis in the final image. Furthermore, although a generalized case of plural spin echoes in a given measurement cycle is depicted at FIG. 2, since each spin echo signal has common y-axis phase encoding, typically only one or two spin echoes are actually utilized and practiced before that particular measurement cycle is terminated and the corresponding "slice" is allowed to "relax" for a T1 interval or more while other "slices" are similarly addressed so as to obtain their spin echo responses. Typically on the order of hundreds of such measurement cycles are utilized (e.g. so as to obtain enough data to provide hundreds of lines of resolution along the y-axis).

As may be better understood by reading the above referenced related patents/patent application, a sequence of M such y-axis phase encoded spin echo signals may be subjected to a two-dimensional Fourier transformation process so as to result in M×M pixel values for a resulting NMR image.

Section thickness in multi-dimensional Fourier transform imaging is dependent upon the strength of the magnetic gradient pulse and the shape of the RF nutation pulses used to excite NMR nuclei. By manipulation of the gradient and/or the time domain shaping (and hence the frequency domain shaping as related by Fourier transformation) of the RF nutation pulses, it is now possible to obtain contiguous multi-section imaging with each slice or section being relatively thin (e.g. perhaps as small as 2.5 millimeters or so). Furthermore, because the technique of this invention is quite efficient even when relatively long TR intervals are utilized, it may be used effectively to complement three-dimensional Fourier transformation thin section imaging techniques which typically require much shorter TR cycle periods. In one exemplary embodiment, fifteen double echo contiguous slice images of 0.95×0.95×2.5 millimeters resolution were obtained in a total data acquisition sequence of 17.1 minutes where the TR interval between measurement cycles was two seconds.

The Crooks et al article entitled "Thin Section Definition In Magnetic Resonance Imaging: Technical Concepts And Their Implementation" (*Radiology* 154:463–467, 1985), describes a method for obtaining quite thin MRI section images (on the order of only 2 mm thick while yet maintaining relatively reasonable overall data acquisition sequence times. This method uses three-dimensional Fourier transform techniques on a selected narrow region and is particularly well adapted to short TR imaging capabilities. The same report also describes interleaving two offset arrays of two-dimensional thin section images so as, in the final result, to obtain multiple section images without gaps located between the various planar volumes and sections.

However, such an interleaving technique requires two or more complete data acquisition sequences so that the gaps (which are purposefully designed in this instance to be approximately equal to section thickness) left between the section images obtained during one complete data acquisition sequence are "filled" by the next array of similarly gapped section images obtained in another complete data acquisition sequence. Since a complete data acquisition sequence can involve several minutes usage of an extremely complex and costly MRI apparatus and staff, the disadvantages of this earlier approach to contiguous section imaging become readily apparent Indeed, there is a strong temptation in such circumstances to use a shorter TR interval between individual measurement cycles of a complete acquisition sequence than might otherwise be desirable in an attempt to keep the overall time required for effecting two complete data acquisition sequences within reason. Alternatively, one may simply accept gaps between the imaged sections and hope that some important information has not been lost in the process.

For these and other reasons (e.g. it is sometimes necessary to use longer TR intervals so that one may actually measure the T1 time constant and produce a T1 image), it is desirable to cover an entire region of interest without producing gaps but to do so within a single complete data acquisition sequence—that is, without requiring the "interleaving" of offset but gapped section images obtained in two separate data acquisition sequences. The present invention permits a virtual elimination of gaps in a single data acquisition sequence imaging technique which may provide a succession of contiguous imaged sections having desired thicknessess (e.g. within a range of perhaps 2.5 to 10 mm) using only two-dimensional Fourier transformation techniques or multiple angle projection reconstruction techniques and permitting use of a wide range of TR values between individual measurement cycles of the overall data acquisition sequence.

As will be understood by those in the art, selective NMR excitation techniques are universally used in multi-dimensional MRI so as to define a selected section or relatively thin planar volume. Typically, a magnetic field gradient may be established along a given direction (e.g. z-axis) perpendicular to the desired plane orientation. The gradient then establishes a different magnetic field intensity at each plane orthogonal to the gradient axis. Thus, the nuclei located in each such plane will have a different resonant Larmor frequency. If a perfect magnetic gradient could be realized and if an RF nutation pulse consisting of but a single exact frequency could be realized, then an essentially infinitesimally thin planar volume could be selectively brought to NMR and imaged. By changing the frequency, the excited plane location along the z-axis can be displaced as desired so as to obtain a cross-sectional image at any desired location. However, as will be understood by those in the art, it is not practical to achieve such assumed perfection. Furthermore, such an extremely thin section would excite a relatively fewer number of nuclei thus leading to undesirable reduction of signal to noise ratios and degradation of image quality for that reason.

Figure 3:
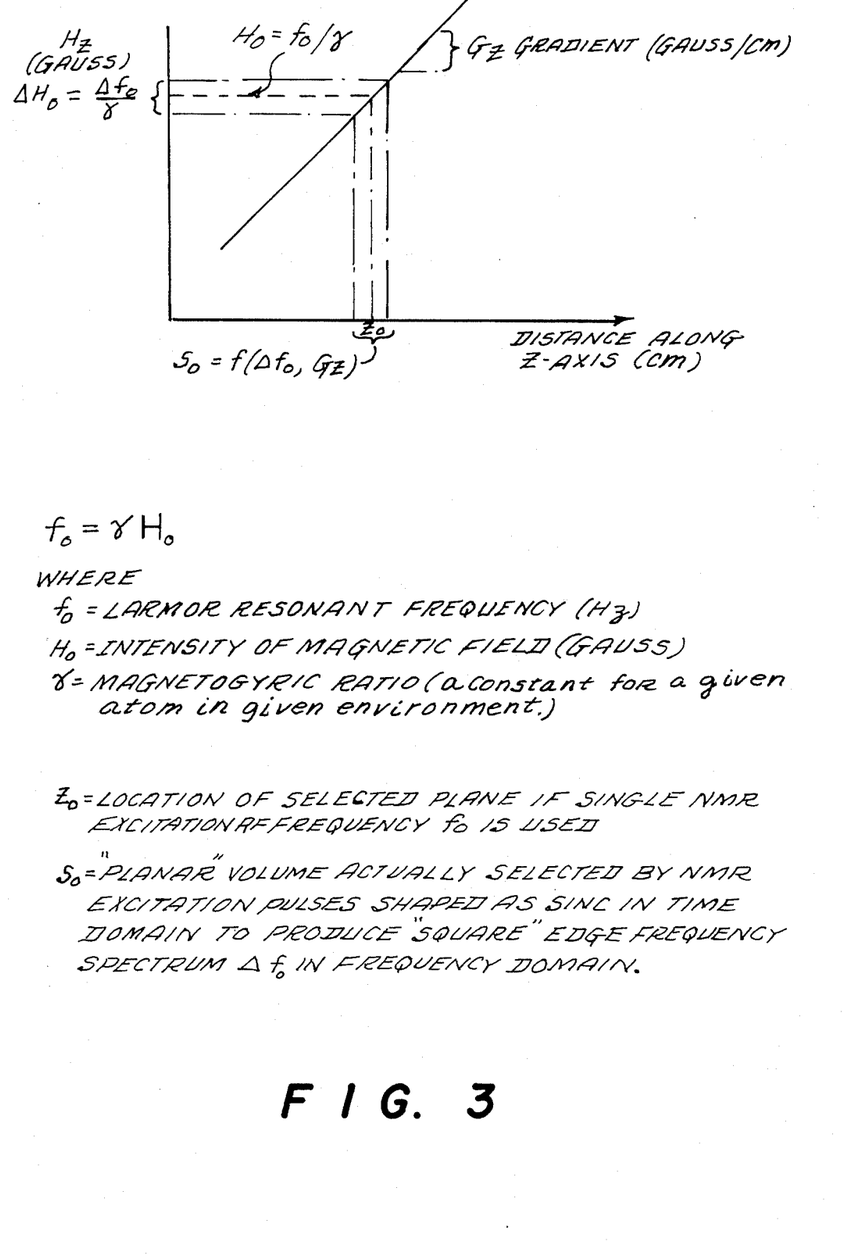
FIG. 3 is a graph showing the relationship between an impressed magnetic gradient, the frequency spectrum of applied RF nutation energy and the resulting selected slice thickness along the z-axis of an object (e.g. a living human or animal subject)

As depicted in FIG. 3, a magnetic gradient $G_z$ is typically superimposed on the static z-axis oriented magnetic field so as to permit slice selection. As just explained, if a single frequency $f_o$ could be chosen, then the Larmor formula would result in the selection only of nuclei located along a single plane at location $z_o$ along the z-axis. However, in reality, a spectrum of RF frequencies $\Delta f_o$ is included in the RF nutation pulse. In accordance with the Larmor formula, this will then define a range of magnetic field intensities $\Delta H_o$ which correspond to the frequencies in the $\Delta f_o$ range. In turn, depending upon the slope of the gradient (i.e. the magnitude of the applied gradient), a range of distance or slice thickness $S_o$ will be defined as containing nuclei whose resonant frequencies correspond to the $\Delta f_o$ RF frequency spectrum. The nuclei nutated by an RF pulse with this $\Delta f_o$ spectrum correspond closely to those with resonant frequencies in the $\Delta f_o$ region. Exactly which nuclei along the gradient are nutated and the precise nutation angle can be determined by applying the Bloch equations with the shaped RF waveforms described in the above referenced papers. As should now be appreciated from FIG. 3, the width or thickness of such a selected slice is a function of of $G_z$. The center of a slice depends on the center frequency of $\Delta f_o$ and the slice width is closely related to the width of $\Delta f_o$ and can be exactly determined using the Bloch equations.

Thus, the width of a selected section in the object being imaged is defined by the two independently controllable parameters $\Delta f_o$ and $G_z$. If the applied frequency spectrum is wide, then the section will be relatively thick because the Larmor resonance condition is satisfied throughout a thicker slice of the subject and vice-versa. If the gradient strength $G_z$ is strong, then the field will change more steeply with respect to distance along the z-axis for any given range of applied frequencies $\Delta f_o$ and, accordingly, a thinner section of the subject will be selectively excited to NMR and vice-versa.

For any one MRI system configuration, there is always a maximum gradient strength that can be established (e.g. depending upon the design of the gradient power supplies, amplifiers, coils, etc.). Once the maximum gradient has been utilized, the selected section can be further reduced by either (a) using offset excitation techniques with interleaved imaging with consequent penalties in total data acquisition time as discussed in the abovereferenced Crooks et al article and/or in Feinberg et al "Pulsatile Blood Velocity In Human Articles Displayed By Magnetic Resonance Imaging", (Radiology 153:177–180, 1984), or (b) narrowing the frequency spectrum included in the applied RF excitation or nutation pulses.

As will be understood by those in the art, the time domain shape of the applied RF nutation pulse is related to the frequency domain spectrum by Fourier transformation. For example, an RF nutation pulse having a perfect sinc function shaped envelope in the time domain would produce a perfect "square" shaped frequency spectrum. In general, abrupt transitions in the time domain envelope result in a widened frequency spectrum For example, a delta or impulse function in the time domain should produce a virtually uniform frequency spectrum. Smoother time domain envelope shapes for the RF nutation pulse will result in a relatively narrower frequency spectrum. One typical "rule of thumb" is that, for simple shapes in the time domain, the resulting frequency spectrum is inversely proportional to the duration of the time domain pulse. For example, a time domain RF nutation pulse of approximately 10 ms duration will result in a frequency spectrum range of approximately 100 Hz. Since the magnetogyric ratio $\gamma$ for hydrogen NMR is approximately 4,258 Hz/gauss, a sharp edged frequency spectrum of 100 Hz width in the frequency domain will select resonant nuclei within a range of approximately 0.0235 gauss magnetic field intensities. For example, if it is assumed that the magnetic gradient $G_z = 1$ gauss per cm, then a 100 Hz wide frequency spectrum will "select" a slice thickness of about 0.0235 cm. Summarizing:

$\Delta f = $ approximately $1/\Delta t$ [Equation 1]

$\Delta H_o = $ approximately $\Delta f / 4258$ for hydrogen [Equation 2]

$\Delta z = $ approximately $\Delta H_o / G_z$ [Equation 3]

where z is the coordinate orthogonal to the imaging plane. Combining these equations for hydrogen yields:

$\Delta z = $ approximately $1/[4258 \times \Delta t \times G_z]$ [Equation 4]

where $\Delta z$ is the section thickness in centimeters, $\Delta t$ is the excitation pulse duration in seconds and $G_z$ is expressed in gauss per centimeter.

As earlier mentioned, in MRI it is desirable to use sinc shaped envelopes for the time domain RF nutation pulses so as to achieve an approximately "square" shaped frequency spectrum—and thus to achieve an approximately "square" shaped edge on each selected planar volume of NMR nuclei. There are at least three important underlying reasons for such an attempt to obtain "square" selected planar volumes.

The first is common to all tomographic imaging techniques where one attempts to avoid unequal sensitivity to features within the selected section or, equivalently, a "blurring" effect from including features "outside" the selected section in the data captured for creating an image of a desired section. For example, assuming a Gaussian cross-sectional nutation the affected section thickness may be defined at the full width half maximum (FWHM) while in effect, the actual sensitivity (i.e. region from which detected signal components are included) may extend to a considerably greater extent (e.g. to the full width tenth maximum FW0.1M). One can consider the selected section as having an effective width equal to the somewhat wider FW0.1M (and unequal sensitivity within the selected slice) or, alternatively, it may be considered as having a "width" equal to the somewhat smaller FWHM but including "blurring" from a certain surrounding region.

In addition, there are two further problems unique to MRI (as opposed to other types of tomographic imaging). First of all, in multisection imaging, the Gaussian spread function forces separation between section centers that are equal to or larger than the FW0.1M so as to avoid interference effects between data elicited from adjacent slices. Because roughly half of that space is occupied by the less than desired nutation regions of the Gaussian function, interleaved imaging is then necessary for visualization of any features that happen to fall within the interslice gaps. Secondly, if one wants to acquire meaningful relaxation time information (e.g. so as to calculate T1 and/or T2 time constants for each imaged voxel), then this desired procedure may be precluded by the irradiation characteristics of the Gaussian function.

For example, one typically presumes that the 90° and 180° NMR nutation pulses accurately effect 90° and 180° nutations, respectively, of the magnetization vectors for NMR nuclei. Actually, if a Gaussian shaped selective excitation function is assumed, and if the peak amplitude of nutation produces the desired 90° change, then, by definition, at the FWHM point, one achieves only half the desired change (e.g. 45°). Note that the signal is proportional to the sine of the nutation angle so the signal from this location is sin (45°) =0.7071 of the signal at the center which is flipped 90°. Similarly, the 180° nutation pulse actually provides only a 90° flip angle at its FWHM. Therefore. many if not most of the NMR nuclei within the selected section undergo flip angles considerably less than the desired 90° and 180° changes and, as a consequence, relaxation time data related to T1 and T2 time constants may be inaccurate. Furthermore, even if one does not desire accurate measurement of T1 and T2 time constants, a straightforward image of detected NMR intensity will still result in somewhat unpredictable object contrast changes due to inconsistent responses caused by the less than desired actual flip angles.

Clearly, then, "square" selected volumes are desired for optimum MRI. As previously mentioned, a true sinc function would provide the desired "square" edges in the frequency domain—but it is impractically long. Reasonable approximations are therefore made by truncating the infinitely long sinc shaped pulse envelope to one of only about 8-12 zero crossings. Variants of the sinc function may also possibly be used to improve response in view of the Bloch equations as will be understood by those in the art. The gross width of the selected section typically depends upon the duration of the central component of the truncated sinc function while the number of zero crossings included within the truncated pulse improves the "sharpness" with which the edge of the resulting frequency spectrum is defined.

With such considerations in mind, one may produce quite thin selected sections at any one fixed gradient strength (note that field strength per se does not affect section thickness but, rather, only the value of the selected gradient or slope as shown in FIG. 3). The penalty associated with reducing section thickness and increasing edge sharpness is that the truncated sinc function excitation pulses must be lengthened and this, in turn, necessarily lengthens the earliest time at which a spin echo can be acquired so as to measure T2 parameters. However, to the extent that the pathology of interest is easily visualized using only relatively long TR and relatively long TE times, such a penalty is not necessarily detrimental.

Figure 4:
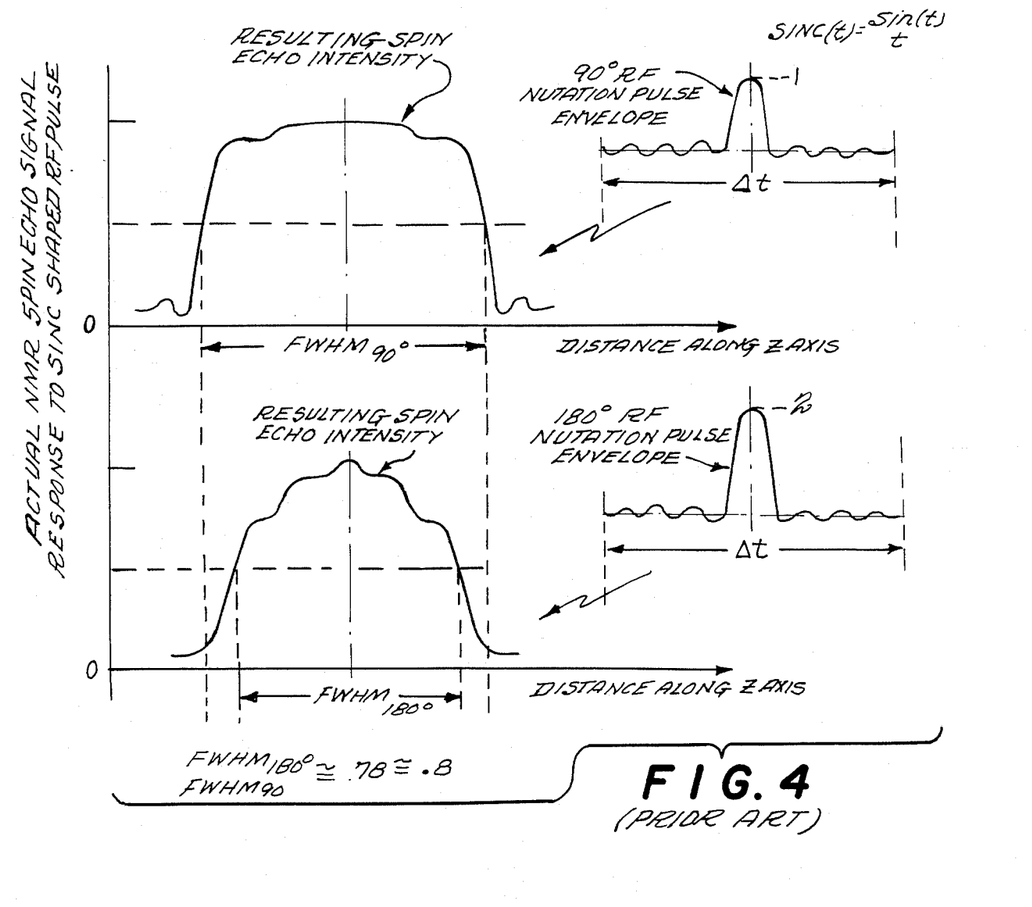
FIG. 4 contains a sequence of graphical representations of 90° and 180° RF nutation pulse envelopes (as a function of time) and the resulting amount of spin echo signal produced in response to such RF excitation as a function of distance along the z-axis, all in accordance with conventional prior art techniques so as to illustrate the typical prior art mismatch of slice widths actually "selected" by the 90° and 180° RF nutation pulses.
Figure 5:
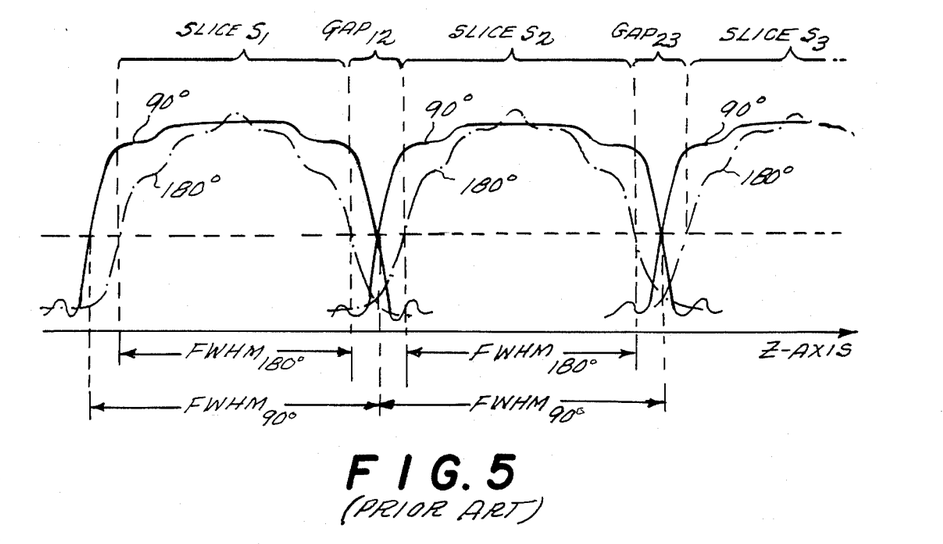
FIG. 5 is a graphical depiction of the signal producing regions for a succession of nuclei nutations versus distance along the z-axis for overlapped 90° and 180° nutation pulses in accordance with the prior art practices of FIG. 4 so as to illustrate the resulting non-imaged gaps between selected slices.

As depicted in FIG. 4, it has been discovered that typical prior dimensioning of 90° and 180° RF nutation pulses (e.g. where the 180° pulse envelope is simply increased in amplitude sufficiently to provide twice the area thereunder as compared to the 90° pulse) result in the FWHM of the spin echo signal (in the curve depicting variation in actual spin echo signal versus z-axis distance) for the 180° pulse being only approximately 80% of the FWHM for the 90° nutation pulse. Accordingly, when a succession of slice images are taken using such prior art techniques, the result is a non-imaged gap area between each pair of slices as depicted at FIG. 5.

The signal profiles of FIG. 4 are measured from spin echoes of a 90°, 180° sequence where the profile for the 90° pulse is deduced by turning off the selective gradient during the 180° pulse and the profile for the 180° pulse is deduced by turning off the selective gradient during the 90° pulse.

Figure 6:
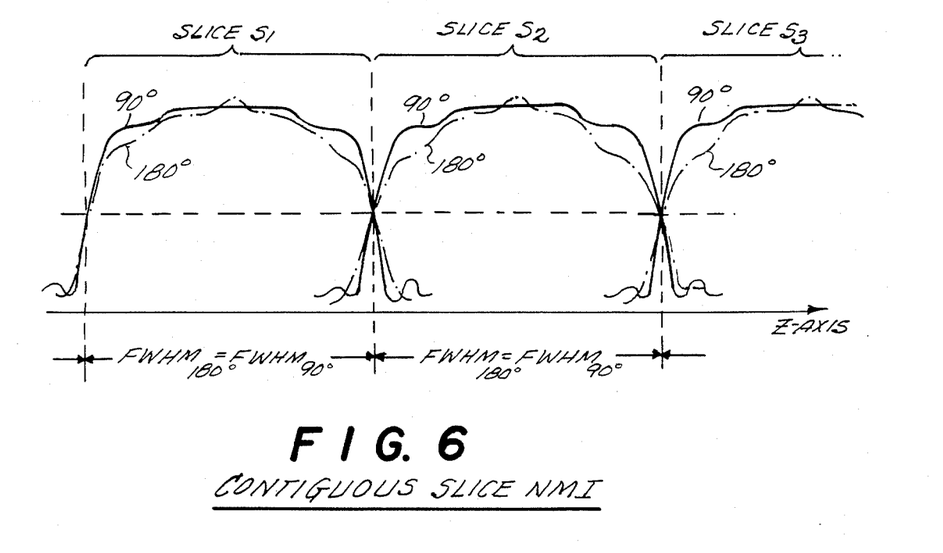
FIG. 6 is a series of graphs similar to those shown in FIG. 5 but with the effective slice thickness of the 180° nutation curves having been widened to match those for the 90° nutation pulses thus minimizing or eliminating the prior art non-imaged gaps.

In accordance with this invention, the "width" of the 90° nutation pulse is more closely matched with that of the 180° RF nutation pulse as depicted in FIG. 6. Accordingly, the gaps between imaged slices are substantially reduced or even eliminated (e.g. a minimum 20% gap or so using prior art techniques may be reduced to less than a 10% gap dimension).

The desired matching of selective nutation effects with the 90° and 180° nutation pulses can be achieved by suitably changing the applied frequency spectra and/or by adjusting the magnitude of the slice selective magnetic gradient which is applied in association with a given nutation pulse so as to select a given slice width as depicted in FIG. 3. In the presently preferred exemplary embodiment, it is believed easiest to simply reduce the magnitude of the slice selective magnetic gradient used for the 180° nutation pulse to a value equal to approximately 80% of that used for the 90° nutation pulse. Of course, one must also properly adjust the center frequency increment used to position the slices by a similar scaling so as to achieve the desired selected slice.

One additional advantage which results from reducing the magnitude of the selective magnetic gradient is that the power dissipation and perhaps other requirements for the magnetic gradient amplifiers and the like may be substantially reduced. For example, since there are more 180° pulses than 90° pulses in the exemplary data acquisition sequence of FIG. 2, reducing the magnitude of the magnetic gradient pulses during each 180° nutation pulse may significantly reduce the effective duty cycle imposed upon the gradient amplifiers.

Figure 7:
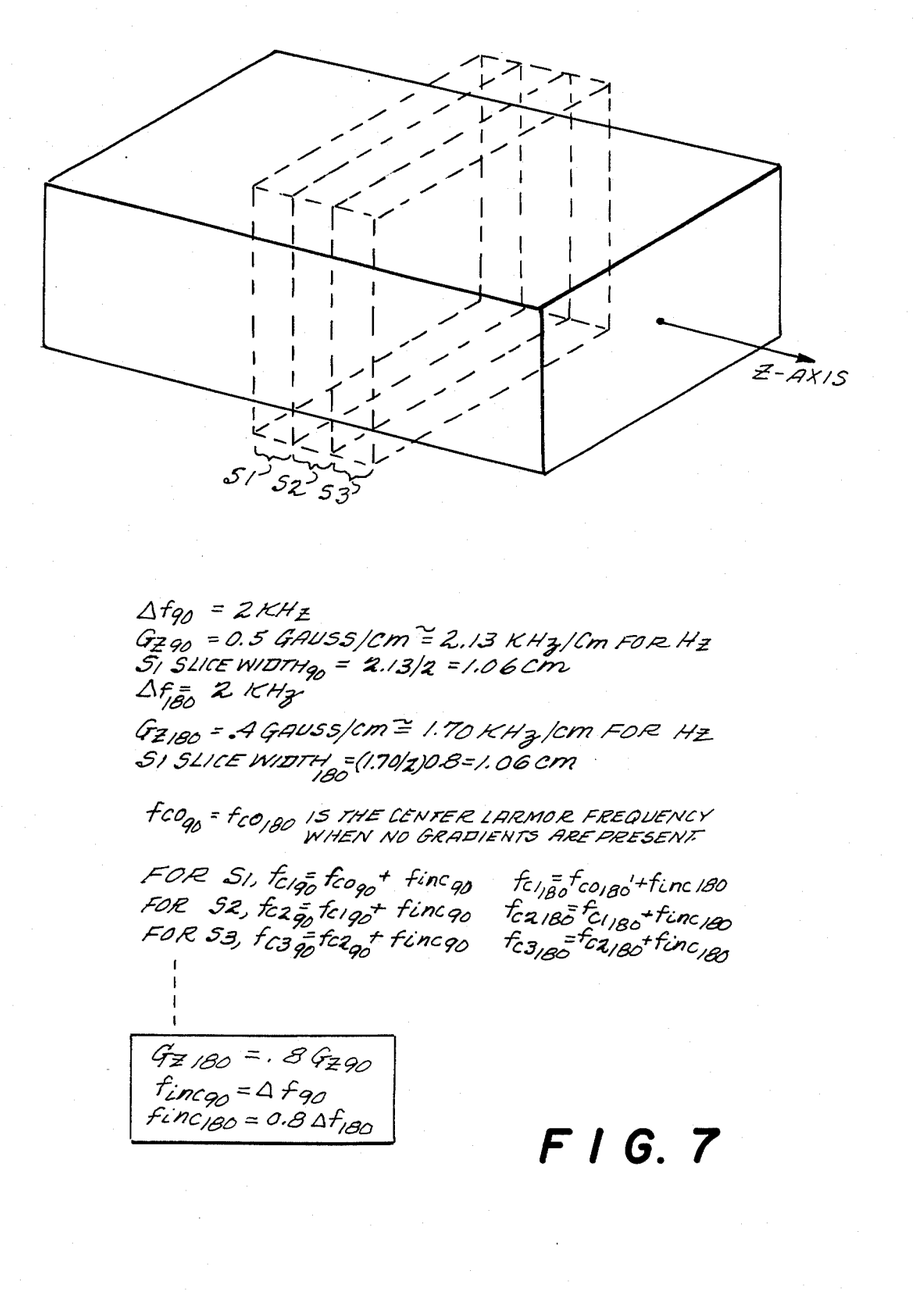
FIG. 7 is a schematic depiction of the substantially contiguous slices in multislice MRI which may be achieved utilizing the principles of this invention.

One example of contiguous slice imaging in accordance with the invention is depicted at FIG. 7. Here a typical 90° nutation pulse of $\Delta f = 2$ KHz (and frequency increment 2 KHz) occurring during a z-axis magnetic gradient pulse $G_z = 0.5$ gauss/cm starts off a measurement cycle. However the 180° nutation pulses employ a reduced $G_z = 0.4$ gauss/cm (i.e. reduced to an 80% value) and a correspondingly scaled center frequency increment of 1.6 KHz but retains the $\Delta f = 2$ KHz (which gives only an 80% FWHM) so as to achieve FWHM matching. Successive cycles are then performed for contiguous slices S1, S2, S3 . . . by incrementing the location of the center frequency $f_c$ of each frequency spectrum $\Delta f$ as also depicted in FIG. 7.

Figure 8:
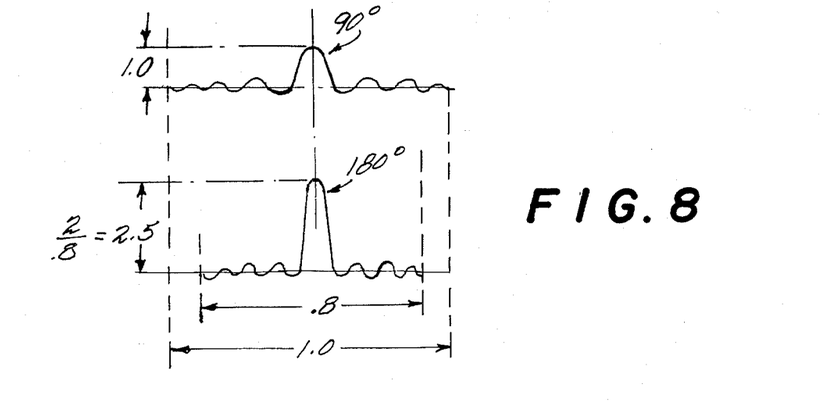
FIG. 8 is a schematic depiction of an alternate technique for achieving 90°/180° FWHM matching by altering the time domain shape of the RF NMR nutation pulses.

Alternatively, rather than changing the $G_z$ value, the 90° and 180° sinc pulses can be shaped in the time domain as depicted in FIG. 8 so as to achieve FWHM matching in the spatial/frequency domain. For example, as depicted in FIG. 8, the 180° sinc pulse duration may be shortened to 80% of that used for the 90° pulse (to suitably widen the frequency spectrum) while the normal 2× amplitude is increased by 125% to 2.5× (so as to maintain the necessary 2× area under the more brief sinc curve). In this case the center frequency increments for the 90° and 180° pulses are the same.

Figure 9:
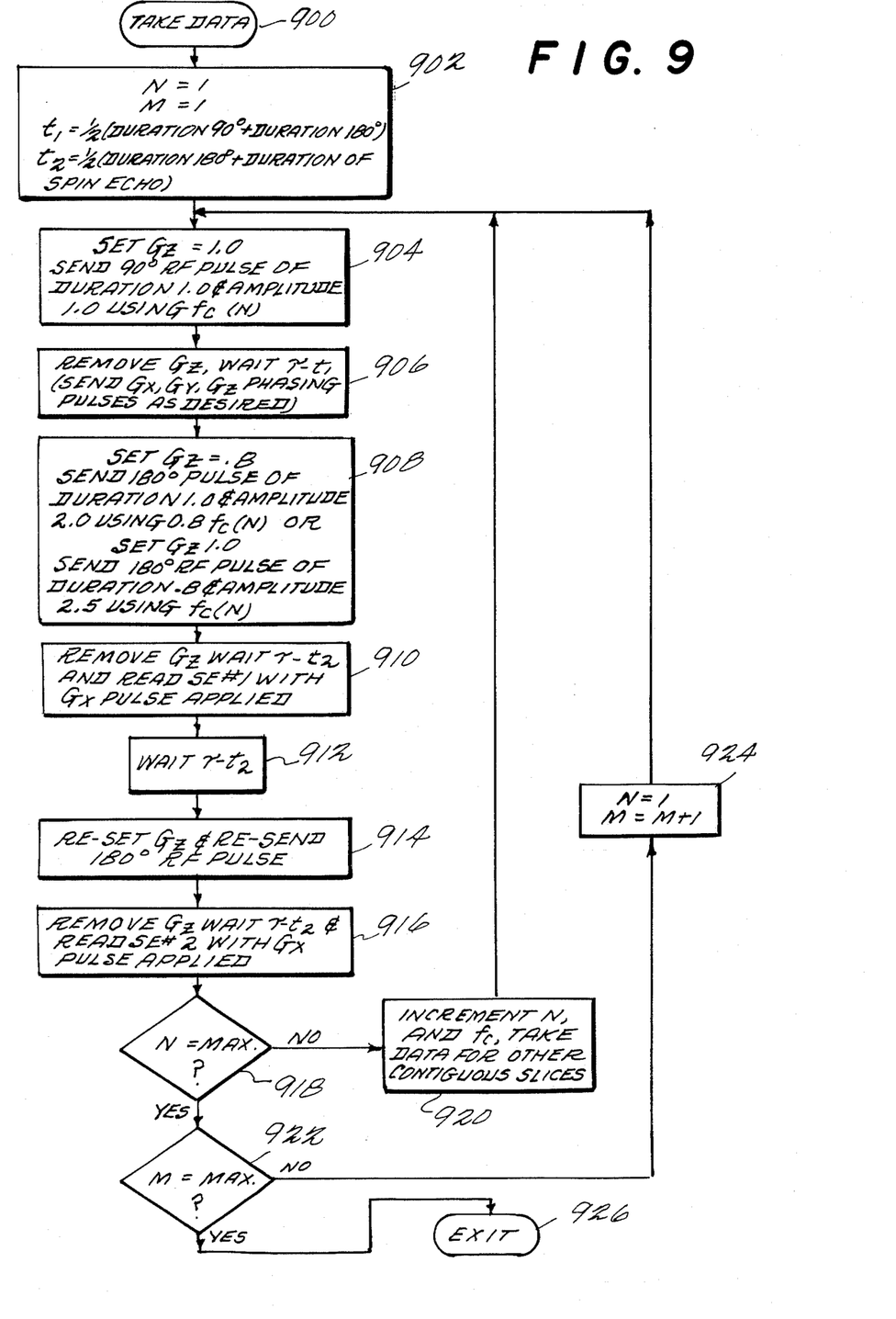
FIG. 9 is a flow chart outlining a suitable controlling computer program for the exemplary embodiment of FIG. 1.

A possible computer controlling program for data acquisition computer 26 is outlined in the flow chart of FIG. 9. Here, upon entry at 900 to a data acquisition routine, loop counters N and M are initialized and time delays $t_1$ and $t_2$ are calculated at 902. $t_1 = \frac{1}{2}$ (duration of the 90° RF pulse plus the duration of the 180° RF pulse) and $t_2 = \frac{1}{2}$ (duration of the 180° RF pulse plus the duration of the spin echo observation). Then, at 904, a normal 90° nutation pulse (e.g. of relative duration 1.0 and amplitude 1.0 at slice selection center frequency $f_c(N)$ is sent into the object under test in the presence of a $G_z$ relative value of 1.0. After a wait of $\tau - t_1$ seconds at 906 (which may include rephasing or other gradient pulses), a specially dimensioned 180° pulse protocol is used at 908. As earlier explained, the magnetic gradient value and/or the time domain envelope of the 180° RF pulse is dimensioned to provide FWHM matching with the 90° pulse effects in the spatial domain.

Thereafter, the usual further $\tau - t_2$ wait and reading of the first spin echo signal centered at time $2\tau$ is effected at 910. If desired, a further similar 180° pulse may be used to generate a second spin echo response as depicted at steps 912, 914 and 916. The slice counter N is tested at 918. If it has not yet reached the desired maximum value, then the slice counter N is incremented at 920, as is the center frequency of the RF spectrum and data is taken for other contiguous slices using a sequence analogous to that of steps 904–916. When the slice counter N has reached its maximum value the measurement sequence counter M is tested at 922. If it has not yet reached the desired maximum value it is incremented and the slice counter N is reset to 1 at 924 and the process loops back to step 904 to take the next measurement (e.g. after a T1 interval has elapsed from the last excitation of slice N=1). Eventually the required number of individual measurement cycles M will have been taken (e.g. 128 or 256), the test for maximum M at 922 will be successful and exit from the subroutine will be taken at step 926 when a complete multi-slice data acquisition sequence is completed.

While only a few exemplary embodiments of this invention have been described in detail, those skilled in the art will recognize that many. modifications and variations may be made in these exemplary embodiments while yet retaining many of the novel features and advantages of this invention. Accordingly, all such variations and modifications are intended to be included in the appended claims.

What is claimed is:

1. An improved magnetic resonance imaging method comprising:
    using a train of plural RF NMR nutation pulses, each occurring during imposition of a magnetic gradient pulse, to elicit NMR RF spin echo responses from a succession of selected slices or planar volumes of an object to be imaged;
    producing $\phi_1$ and $\phi_2$ RF NMR nutation pulses and controlling the time domain envelope of said $\phi_1$ and $\phi_2$ RF NMR nutation pulses and the magnitude of said magnetic gradient pulses to effect a succession of angular nuclei nutations within and across substantially all of each slice to elicit at least one NMR spin echo response therefrom; and
    controlling the frequency spectrum of said RF NMR nutation pulses to cause said succession of selected slices to be substantially contiguous.

2. An improved magnetic resonance imaging method as in claim 1 wherein the magnetic gradient pulse employed during $\phi_1$ RF pulses has a magnitude different from that employed during $\phi_2$ RF pulses for a given slice.

3. An improved magnetic resonance imaging method as in claim 1 wherein said $\phi_2$ RF pulses have a shorter duration and higher magnitude envelope in the time domain than said $\phi_1$ RF pulses.

4. An improved magentic resonance imaging method comprising:
    using a train of plural RF NMR nutation pulses, each occurring during imposition of a magnetic gradient pulse, to elicit NMR RF spin echo responses from a succession of selected slices or planar volumes of an object to be imaged;
    producing $\phi_1$ and $\phi_2$ RF NMR nutation pulses and controlling the time domain envelope of said $\phi_1$ and $\phi_2$ RF NMR nutation pulses and the magnitude of said magnetic gradient pulses to effect a succession of angular nuclei nutations within and across substantially all of each slice to elicit at least one NMR spin echo response therefrom; and
    controlling the frequency spectrum of said RF NMR nutation pulses to cause said succession of selected slices to be substantially contiguous;
    wherein said producing step is performed with $\phi_1 = 90°$, $\phi_2 = 180°$ and the magnetic gradient pulse employed during 180° RF pulses having a magnitude approximately 80% of that employed during 90° RF pulses.

5. An improved magnetic resonance imaging method comprising:
    using a train of plural RF NMR nutation pulses, each occurring during imposition of a magnetic gradient pulse, to elicit NMR RF spin echo responses from a succession of selected slices or planar volumes of an object to be imaged;
    producing $\phi_1$ and $\phi_2$ RF NMR nutation pulses and controlling the time domain envelope of said $\phi_1$ and $\phi_2$ RF NMR nutation pulses and the magnitude of said magnetic gradient pulses to effect a succession of angular nuclei nutations within and across substantially all of each slice to elicit at least one NMR spin echo response therefrom; and
    controlling the frequency spectrum of said RF NMR nutation pulses to cause said succession of selected slices to be substantially contiguous;
    wherein said $\phi_2$ RF pulses have a shorter duration and higher magnitude envelope in the time domain than said $\phi_1$ RF pulses; and
    wherein $\phi_1$ is 90°, $\phi_2$ is 180° and wherein the time duration of the 180° RF pulse is approximately 80% of the 90° RF pulse duration and wherein the envelope magnitude of the 180° RF pulse is approximately 250% of the 90° RF pulse envelope magnitude.

6. An improved magnetic resonance imaging method comprising:

sequentially transmitting $\phi_1$ and $\phi_2$ RF nutation pulses of RF frequency spectra $\Delta f_1$ and $\Delta f_2$ respectively into an object to be iamged in the presence of a slice-selective magnetic gradient pulse G such that corresponding first and second nuclei nutation versus displacement variations $V_1$, $V_2$ in the spatial domain are produced within a selected slice or planar volume of the object; and controlling the time-domain envelope of at lesat one of (a) said $\phi_1$ RF nutation pulse, (b) said $\phi_2$ RF nutation pulse, and (c) said magnetic gradient pulse G to produce substantial width-matching of said first and second nuclei nutation versus displacement variations $V_1$, $V_2$ in the spatial domain.

7. An improved magnetic resonance imaging method as in claim 6 wherein $\phi_1$ is 90°, $\phi_2$ is 180° and G during each 180° pulse is approximately 80% of the G magnitude during 90° pulses.

8. An improved magnetic resonance imaging method as in claim 6 wherein G during said $\phi_2$ pulses is of different magnitude than during said $\phi_1$ pulses.

9. An improved magnetic resonance imaging method as in claim 6 wherein the center frequency of said $\Delta f_1$ frequency spectrum is different than the center frequency of said $\Delta f_2$ frequency spectrum.

10. An improved magnetic resonance imaging method as in claim 9 wherein $\phi_1$ is 90°, $\phi_2$ is 180°, wherein $\Delta f_2$ is substantially equal to $\Delta f_1$ in width but where increments in the center frequency of $\Delta f_2$ are approximately 80% of the increments in the center frequency $\Delta f_1$.

11. An improved magnetic resonance imaging method as in claim 6 wherein $\phi_1$ is 90°, $\phi_2$ is 180° and wherein $\Delta f_2$ is approximately 125% of $\Delta f_1$ in width but where said $\Delta f_1$ and $\Delta f_2$ spectra have substantially equal center frequencies.

12. An improved magnetic resonance imaging method as in claim 6 wherein said $\phi_2$ RF pulses have a shorter duration and higher envelope magnitude than said $\phi_1$ RF pulses in the time domain.

13. An improved magnetic resonance imaging method as in claim 12 wherein $\phi_1$ is 90°, $\phi_2$ is 180° and wherein the time duration of the 180° RF pulse is approximately 80% of the 90° RF pulse duration and wherein the envelope magnitude of the 180° RF pulse is approximately 250% of the 90° RF pulse envelope magnitude.

14. An improved magnetic resonance imaging method as in claim 6 further comprising successively incrementing the center frequencies of $\Delta f_1$ and $\Delta f_2$ to select substantially contiguous successive slices of said object to be imaged.

15. An improved magnetic resonance imaging apparatus of the type which uses a train of plural RF NMR nutation pulses, each occurring during imposition of a magnetic gradient pulse, so as to elicit NMR RF spin echo responses from a succession of selected slices or planar volumes of an object to be imaged, said improvement comprising:

means for producing $\phi_1$ and $\phi_2$ RF NMR nutation pulses and for controlling the time domain envelope of said $\phi_1$ and $\phi_2$ RF NMR nutation pulses and the magnitude of said magnetic gradient pulses so as to effect a succession of angular nuclei nutations within and across substantially all of each slice to elicit at least one NMR spin echo response therefrom; and means for controlling the frequency spectrum of said RF NMR nutation pulses to cause said succession of selected slices to be substantially contiguous.

16. An improved magnetic resonance imaging apparatus as in claim 15 wherein said first-mentioned means causing the magnetic gradient pulse employed during $\phi_1$ RF pulses to have a magnitude different from that employed during $\phi_2$ RF pulses for a given slice.

17. An improved magnetic resonance imaging apparatus as in claim 15 wherein said first-mentioned means includes means causing said $\phi_2$ RF pulses have a shorter duration and higher magnitude envelope in the time domain than said $\phi_1$ RF pulses.

18. An improved magnetic resonance imaging apparatus of the type which uses a train of plural RF NMR nutation pulses, each occurring during imposition of a magnetic gradient pulse, so as to elicit NMR RF spin echo responses from a succession of selected slices of planar volumes of an object to be imaged, said improvement comprising:

means for producing $\phi_1$ and $\phi_2$ RF NMR nutation pulses and for controlling the time domain envelope of said $\phi_1$ and $\phi_2$ RF NMR nutation pulses and the magnitude of said magnetic gradient pulses so as to effect a succession of anular nuclei nutations within and across substantially all of each slice to elicit at least one NMR spin echo response therefrom; and means for controlling the frequency spectrum of said RF NMR nutation pulses to cause said succession of selected slices to be substantially contiguous;

wherein said first-mentioned means includes means causing $\phi_1$ to be 90°, $\phi_2$ to be 180° and the magnetic gradient pulse employed during 180° RF pulses having a magnitude approximately 80% of that employed during 90° RF pulses.

19. An improved magnetic resonance imaging apparatus of the type which uses a train of plural RF NMR nutation pulses, each occurring during imposition of a magnetic gradient pulse, so as to elicit NMR RF spin echo responses from a succession of selected slices or planar volumes of an object to be imaged, said improvement comprising:

means for producing $\phi_1$ and $\phi_2$ RF NMR nutation pulses and for controlling the time domain envelope of said $\phi_1$ and $\phi_2$ RF NMR nutation pulses and the magnitude of said magnetic gradient pulses so as to effect a succession of angular nuclei nutations within and across substantially all of each slice to elicit at least one NMR spin echo response therefrom; and means for controlling the frequency spectrum of said RF NMR nutation pulses to cause said succession of selected slices to be substantially contiguous;

wherein said first-mentioned means includes means causing said $\phi_2$ RF pulses have a shorter duration and higher magnitude envelope in the time domain than said $\phi_1$ pulses; and wherein $\phi_1$ is 90°, $\phi_2$ is 180° and wherein the time duration of the 180° RF pulse is approximately 80% of the 90° RF pulse duration and wherein the envelope magnitude of the 180° RF pulse is approximately 250% of the 90° RF pulse envelope magnitude.

20. An improved magnetic resonance imaging apparatus of the type which sequentially transmits $\phi_1$ and $\phi_2$ RF nutation pulses of RF frequency spectra $\Delta f_1$ and $\Delta f_2$ respectively into an object to be imaged in the presence of a slice-selective magnetic gradient pulse G such that corresponding first and second nuclei nutation versus displacement variations $V_1$, $V_2$ in the spatial domain are produced within a selected slice or planar volume of the object, said improvement comprising:

means for cntrolling the time-domain envelope of said $\phi_1$ and $\phi_2$ RF nutation pulses and/or said magnetic gradient pulse G to produce substantial width-matching of said first and second nuclei nutation versus displacement variations $V_1$, $V_2$ in the spatial domain.

21. An improved magnetic resonance imaging apparatus as in claim 20 wherein $\phi_1$ is 90°, $\phi_2$ is 180° and G during each 180° pulse is approximately 80% of the G magnitude during 90° pulses.

22. An improved magnetic resonance imaging apparatus as in claim 20 wherein G during said $\phi_2$ pulses is of different magnitude than during said $\phi_1$ pulses.

23. An improved magnetic resonance imaging apparatus as in claim 20 wherein the center frequency of said $\Delta f_1$ frequency spectrum is different than the center frequency of said $\Delta f_2$ frequency spectrum.

24. An improved magnetic resonance imaging apparatus as in claim 23 wherein $\phi_1$ is 90°, $\phi_2$ is 180°, wherein $\Delta f_1$ is substantially equal to $\phi_2$ in width but where increments in the center frequency of $\Delta f_2$ are approximately 80% of the increments in the center frequency of $\Delta f_1$.

25. An improved magnetic resonance imaging apparatus as in claim 20 wherein $\phi_1$ is 90°, $\phi_2$ is 180° and wherein $\Delta f_2$ is approximately 125% of $\Delta f_1$ in width but where said $\Delta f_1$ and $\Delta f_2$ spectra have substantially equal center frequencies.

26. An improved magnetic resonance imaging apparatus as in claim 20 wherein said $\phi_2$ RF pulses have a shorter duration and higher envelope magnitude than said $\phi_1$ RF pulses in the time domain.

27. An improved magnetic resonance imaging apparatus as in claim 26 wherein $\phi_1$ is 90°, $\phi_2$ is 180° and wherein the time duration of the 180° RF pulse is approximately 80% of the 90° RF pulse duration and wherein the envelope magnitude of the 180° RF pulse is approximately 250% of the 90° RF pulse envelope magnitude.

28. An improved magnetic resonance imaging apparatus as in claim 20 further comprising means for successively incrementing the center frequencies of $\Delta f_1$ and $\Delta f_2$ to select substantially contiguous successive slices of said object to be imaged.

* * * * *